United States Patent
Kim et al.

(10) Patent No.: US 8,354,787 B2
(45) Date of Patent: Jan. 15, 2013

(54) ORGANIC ELECTROLUMINESCENT DISPLAY DEVICE

(75) Inventors: Ockhee Kim, Gyeonggi-do (KR); Jonghyun Park, Seoul (KR); Jongkyun Lee, Gyeonggi-do (KR); Minki Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 272 days.

(21) Appl. No.: 12/318,608

(22) Filed: Dec. 31, 2008

(65) Prior Publication Data
US 2009/0179556 A1 Jul. 16, 2009

(30) Foreign Application Priority Data
Dec. 31, 2007 (KR) .................. 10-2007-0141808

(51) Int. Cl.
*H01J 1/62* (2006.01)
*H01J 63/04* (2006.01)
(52) U.S. Cl. .............. 313/504; 313/506; 428/690
(58) Field of Classification Search .............. 313/504, 313/512, 506
See application file for complete search history.

(56) References Cited

U.S. PATENT DOCUMENTS

| | | | |
|---|---|---|---|
| 5,085,946 A * | 2/1992 | Saito et al. | 428/690 |
| 2002/0027416 A1 * | 3/2002 | Kim et al. | 313/506 |
| 2002/0090532 A1 * | 7/2002 | Heuer et al. | 428/690 |
| 2002/0093283 A1 | 7/2002 | Seo et al. | |
| 2004/0247937 A1 | 12/2004 | Chen et al. | |
| 2005/0064232 A1 * | 3/2005 | Ishibashi et al. | 428/690 |
| 2005/0221121 A1 | 10/2005 | Ishihara et al. | |
| 2006/0051615 A1 | 3/2006 | Kanno et al. | |
| 2006/0158104 A1 * | 7/2006 | Iijima et al. | 313/504 |
| 2006/0228580 A1 * | 10/2006 | Jeong et al. | 428/690 |
| 2007/0020483 A1 * | 1/2007 | Park et al. | 428/690 |
| 2007/0020484 A1 * | 1/2007 | Kim et al. | 428/690 |
| 2007/0176553 A1 * | 8/2007 | Kwak | 313/512 |
| 2007/0248840 A1 * | 10/2007 | Lin et al. | 428/690 |

FOREIGN PATENT DOCUMENTS

| | | |
|---|---|---|
| CN | 1728904 A | 2/2006 |
| CN | 1758459 A | 4/2006 |
| CN | 1864445 A | 11/2006 |
| CN | 1905235 A | 1/2007 |
| EP | 1 748 504 | 1/2007 |

* cited by examiner

*Primary Examiner* — Mariceli Santiago
*Assistant Examiner* — Glenn Zimmerman
(74) *Attorney, Agent, or Firm* — Morgan, Lewis & Bockius LLP

(57) ABSTRACT

The present disclosure relates to an organic electroluminescent display device. The organic electroluminescent display device according to an embodiment of the present disclosure comprises: a substrate including thin film transistor; a first electrode disposing on the substrate and connecting to the thin film transistor; an electron transport emission layer on the first electrode; and a second electrode on the electron transport emission layer; wherein the electron transport emission layer includes an electron transport material and an emission material.

17 Claims, 8 Drawing Sheets

ORGANIC ELECTROLUMINESCENT DISPLAY DEVICE

This application claims the benefit of Korea Patent Application No. 10-2007-141808 filed on Dec. 31, 2007, which is incorporated herein by reference for all purposes as if fully set forth herein.

BACKGROUND OF THE INVENTION

1. Field of the Invention

The present disclosure relates to a display device. Especially, the present disclosure relates to an organic electroluminescent display device.

2. Discussion of the Related Art

For satisfying the information society developed by the information communication technology, the demands for the electric displays are increasing and the kinds of the display required are varied. To satisfy these requirements of the modern information society, the display element is required to be more precise, larger, thinner, and smallized and to be manufactured with lower cost. To do so, the conventional cathode ray tube (or "CRT") is replaced with new flat panel display (or "FPD").

Especially, the development for the devices relating to the communication and computer such as semiconductor and display is important for advancing the technology in each field. Among the various display elements currently used, the organic electroluminescent display device is one display type occupying the attention for the color thin flat panel display. As the organic electroluminescent display device has excellent characteristics for the graphic display, the television display and the flat panel display such as wide viewing angle, speed response, and high contrast. Further, as it has thin thickness, light weight and good color representation, it is suitable for the next generation flat panel display.

The organic layer of the organic electro luminescent display device comprises the hole injection layer (or "HIL"), the hole transport layer (or "HTL"), the emission layer (or "EML"), the electron transport layer (or "ETL") and the electron injection layer (or "EIL"). Any or some of these elements consisting of the organic layer excepting the emission layer may be differently composed in the organic layer according to the material or the structure of the organic luminescent display device. The organic electroluminescent display device emits the light by forming exciton when the hole generated at the anode electrode and the electron generated at the cathode electrode are jointed at the emission layer after they are passing through the hole injection layer and the electron injection layer, respectively.

For the ideal cases, the hole and the electron should meet at the middle portion of the emission layer. However, due to the materials, the characterisitics, and the thickness of the above mentioned layers, the difference between the mobilities of the hole and electron, and the energy level difference of the each layer ("HOMO" or "LUMO"), the hole and the electron cannot meet at the middle portion of the emission layer, in actual conditions.

Generally, the hole mobility in the organic material used for the hole transport layer can be 10~100 times faster than the electron mobility in the organic material used for the electron transport layer. Therefore, the holes may be earlier transported or injected into the organic emission layer than the electrons. In the interim, in the same organic material, the hole mobility and the electron mobility are decided according to the structure of the organic material. For example, as shown in FIG. 6a, when using an organic material in which the hole mobility is faster than the electron mobility as the emission layer 178, the electrons and holes are colliding near the interface between the electron transport layer 174 and the emission layer 178, not the middle portion of the emission layer 178. In this case, in addition, the difference of HOMO ("highest occupied molecular orbital") between the emission layer 178 and the electron transport layer 174 is very small due to the material characteristics, so that the hole can move to the electron transport layer 174 easily. As a result, the function of the electron transport layer 174 may be degraded and then it may cause the reduction of the life time of the organic electroluminescent element.

In order to overcome the above mentioned drawback, the organic layer may comprise the emission layer only or the material characteristics of each layer may be improved. However, these solutions are seriously depended on the materials, as well as it is hard to find exactly suitable material for the characteristics of the display device. Therefore, there are a lot of researches for enhancing the quality of the organic electroluminescent display device by improving the structure of the device.

SUMMARY OF THE INVENTION

The purpose of the present disclosure is to suggest an organic electroluminescent display device of which service life time is enhanced.

The organic electroluminescent display device according to the first embodiment of the present disclosure comprises: a substrate including thin film transistor; a first electrode disposing on the substrate and connecting to the thin film transistor; an electron transport emission layer on the first electrode; and a second electrode on the electron transport emission layer; wherein the electron transport emission layer includes an electron transport material and an emission material.

Further, at least one of a hole injection layer and a hole transport layer is disposed between the first electrode and the electron transport emission layer.

Still further, at least one of an electron transport layer and an electron injection layer is disposed between the electron transport emission layer and the second electrode.

The thickness of the electron transport emission layer has range of 20~60 nm.

The emission material irradiates one color of red, green and blue colors; and the electron transport material has concentration ratio of 2~20 wt % to the emission material.

When the emission material irradiates red color, the emission material includes BAlq group; and the electron transport material includes at least selected one of Anthracene group, Alq3 group, and BAlq group.

When the emission material irradiates green color, the emission material includes Alq group; and the electron transport material includes at least selected one of Anthracene group, Alq3 group, and BAlq group.

When the emission material irradiates blue color, the emission material includes at least selected one of Perylene group, Anthracene group, ADN and AND derivatives; and the electron transport material includes at least selected one of Anthracene group, Alq3 group, and BAlq group.

The organic electroluminescent display device according to the second embodiment of the present disclosure comprises: a substrate including thin film transistor; a first electrode disposing on the substrate and connecting to the thin film transistor; an emission layer on the first electrode; an electron transport emission layer on the emission layer; and a second electrode on the electron transport emission layer;

wherein the electron transport emission layer includes an electron transport material and an emission material.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
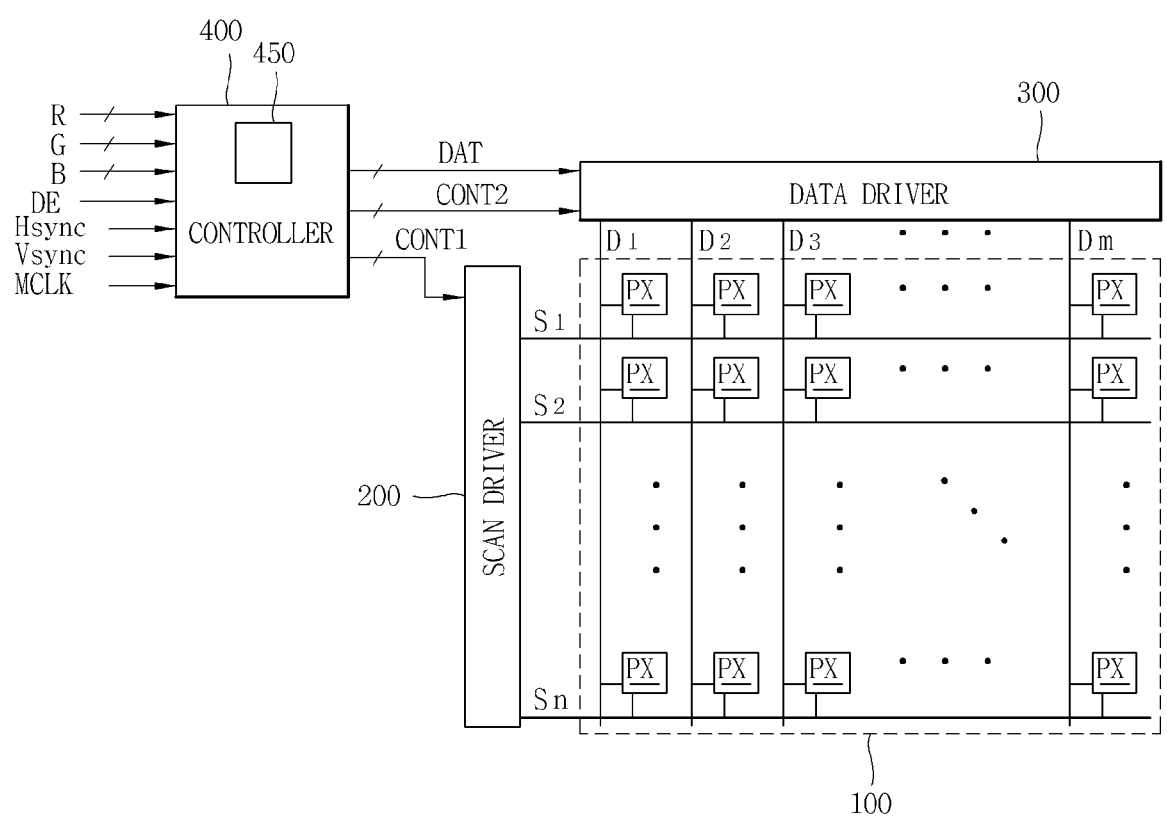
FIG. 1 is a block diagram illustrating the organic electroluminescent display device according to the first embodiment of the present disclosure.

Advantages and features of the present invention and a method of achieving the advantages and the features will be apparent by referring to embodiments described below in detail in connection with the accompanying drawings.

Referring to attached figures, the organic electroluminescent display device according to the preferred embodiment of the present disclosure will be explained in detail. Advantages and features of the present invention and a method of achieving the advantages and the features will be apparent by referring to embodiments described below in detail in connection with the accompanying drawings. Like reference numerals designate like elements throughout the detailed description.

Figure 2A:
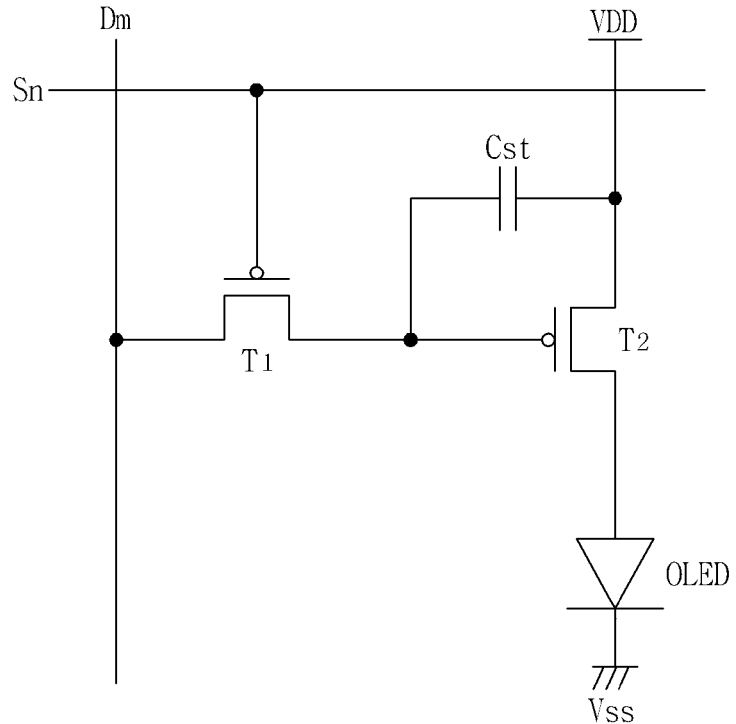
FIGS. 2a to 2b illustrate one example of sub-pixel circuits according to the first embodiment of the present disclosure.
Figure 2B:
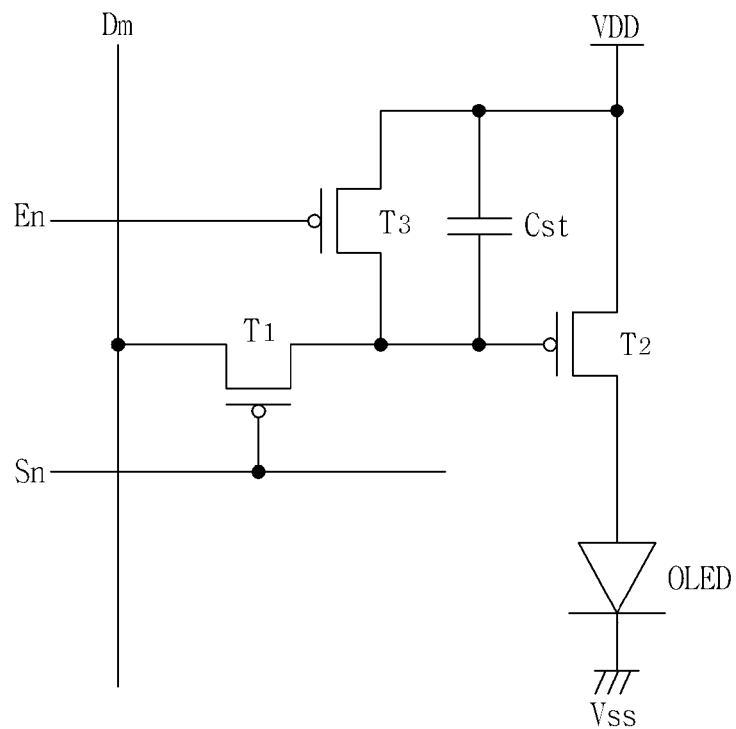

FIG. 1 is a block diagram illustrating the organic electroluminescent display device according to the first embodiment of the present disclosure. FIGS. 2a and 2b are examples of the sub-pixel circuit of the organic electroluminescent display device according to the preferred embodiments of the present disclosure.

Referring to FIG. 1, the organic electroluminescent display device according to the preferred embodiment of the present disclosure includes a display panel 100, a scan driver 200, a data driver 300, and a controller 400.

The display panel 100 includes a plurality of signal lines (S1~Sn and D1~Dm), a plurality of power line (not shown), and a plurality of sub pixel PX connected to these signal lines and arrayed in matrix type. The plurality of signal lines (S1~Sn and D1~Dm) includes a plurality of scan line (S1~Sn) and a plurality of data line (D1~Dm). Each power line (not shown) transmits a first power voltage (VDD) to each sub pixel PX.

In this embodiment, the plurality of signal lines include the scan line (S1~Sn) and the data line (D1~Dm) are illustrated and explained. However, it is not restricted to these elements. According to the driving method, erasing line (not shown) for supplying the erasing signal may be further included.

In some cases, even though the erasing line is applied, the erasing line can be eliminated. In this case, the erasing signal can be supplied via other line. For example, in the case that the power line for supplying a first power voltage (VDD) to the display panel 100, the erasing signal can be supplied through the power line.

Referring to FIG. 2a, the sub pixel PX includes a switching thin film transistor T1 (or "TFT") for transmitting the data signal according to the sance signal from the scan line (S1~Sn), a capacitor (Cst) for storing the data signal, a driving thin film transistor T2 for generating the driving current corresponding to the difference between the data signal stored in the capacitor (Cst) and the first power voltage (VDD), and an emission diode (or "OLED") for emitting light corresponding to the driving current.

Otherwise, as shown in FIG. 2b, the sub pixel PX includes a switching thin film transistor T1 (or "TFT") for transmitting the data signal according to the sance signal from the scan line (S1~Sn), a capacitor (Cst) for storing the data signal, a driving thin film transistor T2 for generating the driving current corresponding to the difference between the data signal stored in the capacitor (Cst) and the first power voltage (VDD), an emission diode (or "OLED") for emitting light corresponding to the driving current, and an erasing switching thin film transistor T3 for erasing the data signal stored in the capacitor (Cst) according to the erasing signal from the erasing line (En).

Referring to FIG. 1 again, the scan driver 200 connects to the scan lines (S1~Sn) of the display panel 100, and supplies the scan signal for turning on the first TFT T1 to the scan lines (S1~Sn) sequentially.

The data driver 300 is connected to the data lines (D1~Dm) of the display panel 100, and supplies the data signal representing the output video signal (DAT) to the data lines (D1~Dm). The data driver 300 may includes at least one data driving IC (or "integrated circuit") connected to the data lines (D1~Dm).

The controller 400 controls the operations of the scan driver 200 and the data driver 300. Further, the controller 400 may includes a signal converter 450 for performing the gamma conversion on the input video signal (RGB) to generate the output video signal (DAT). That is, after generating the scan control signal (CONT1) and the data control signal (CONT2), the controller 400 outputs the scan control signal (CONT1) to the scan driver 200 and it sends the data control signal (CONT2) and the output video signal (DAT) to the data driver 300. In addition, the controller 400 receives the input video signal (R,G,B) and the input control signal for controlling the input video signal from the external graphic controller (not shown). For example, the input control signal may include a vertical synchronizing signal (Vsync), a horizontal synchronizing signal (Hsync), a main clock (MCLK), a data enable signal (DE) and so on.

These drivers 200, 300 and 400 can be made in one IC chip and mounted on the display panel 100. Otherwise, the one chip can be mounted on the flexible printed circuit film (not shown) to be attached on the display panel 100 as a TCP (or "tape carrier package") type or on the printed circuit board (not shown). For other example, these drivers 200, 300 and 400 can be intergratedly formed on the display panel 100 with the plurality of signal lines (S1~Sn) and D1~Dm) and the thin film transistors T1, T2 and T3.

Figure 3:
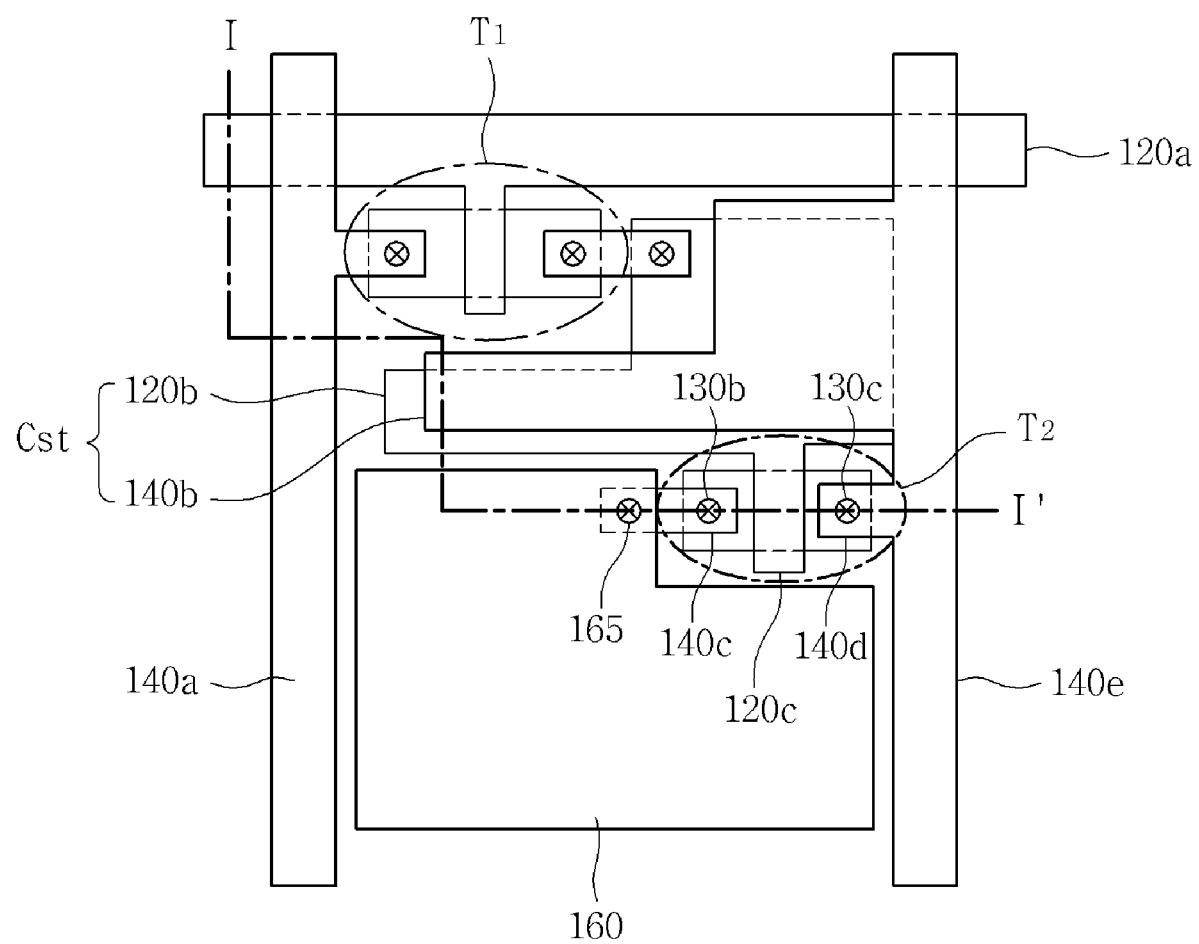
FIG. 3 is a plan view illustrating the organic electroluminescent display device according to the first embodiment of the present disclosure.

FIG. 3 is a plane view illustrating the pixel structure of the organic electroluminescent display device according to the first embodiment of the present disclosure. Referring to FIG. 3, there is a substrate including scan lines 120a running to one direction, data lines 140a crosswisely disposed with the scan line 120a, power lines 140e, and pixel area and non-pixel area defined by the scan lines 120a, data lines 140a and power lines 140e.

In the pixel area, a switching thin film transistor T1 connected to the scan lines 120a and the data lines 140a, a capacitor (Cst) connected to the switching thin film transistor T1 and the power lines 140e, and a driving thin film transistor T2 connected to the capacitor (Cst) and the power lines 140e are disposed. The capacitor (Cst) may include a lower electrode 120b of the capacitor and a upper electrode 140b of the capacitor. Further, in the pixel area, a light emission diode including a first electrode 160 electrically connected to the driving thin film transistor T2, an organic layer (not shown) on the first electrode 160, and a second electrode (not shown) is disposed. The pixel area can further include the scan lines 120a, the data lines 140a and the power lines 140e.

Figure 4:
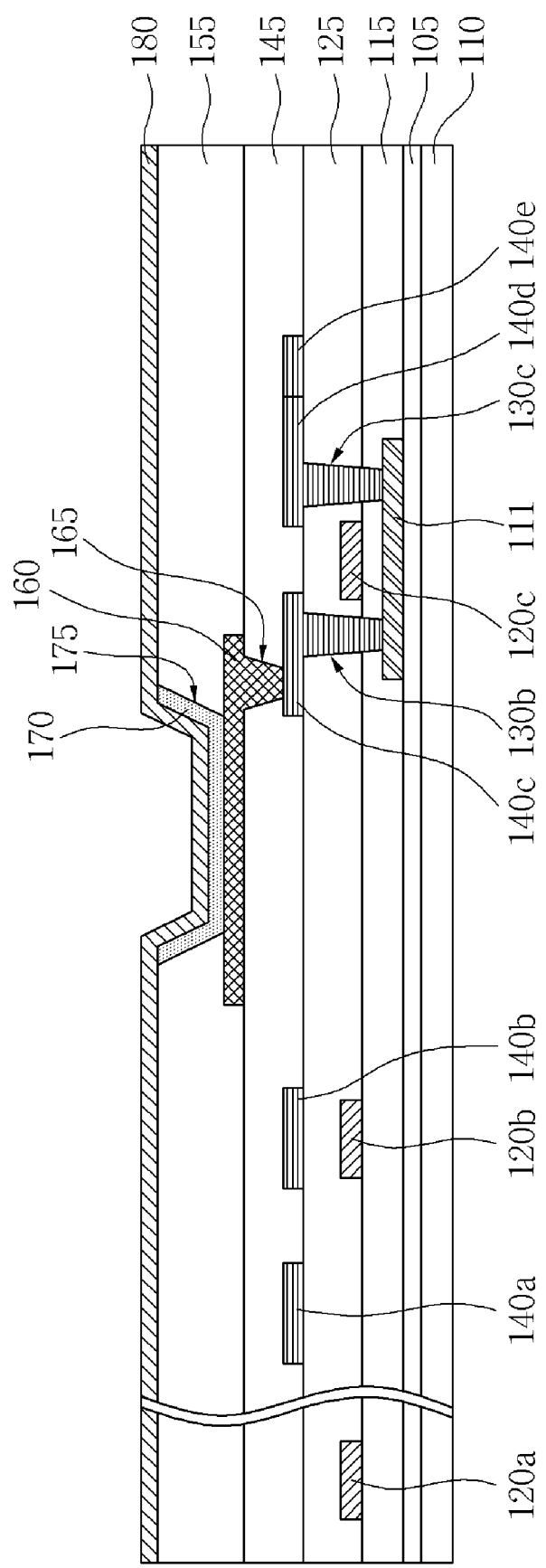
FIG. 4 is a cross sectional view cutting along the line I-I' in the FIG. 3.

FIG. 4 is a cross sectional view cutting along with line I-I' in FIG. 3. Referring to FIG. 4, the organic electroluminescent display device according to the first embodiment of the present disclosure will be explained in detail.

On the substrate 110, a buffer layer 105 is disposed. The buffer layer 105 is formed to protect the thin film transistor formed later from the foreign materials leaked from the substrate 110 such as alkali ions. The buffer layer 105 includes silicon oxide (SiO2) or silicon nitride (SiNx) selectively. Otherwise, the substrate 110 may be made of glass, plastic or metal.

On the buffer layer 105, a semiconductor layer 111 is formed. The semiconductor layer 111 includes amorphous silicon or crystallized poly silicon. Further, the semiconductor layer 111 comprises a source region and drain region dopped with the p-type or n-type impurity. In addition to the source and drain regions, the semiconductor layer 111 includes channel region.

On the semiconductor layer 11, a first insulating layer 115 is formed as a gate insulating layer. The first insulating layer 115 includes a silicon oxide (SiOx) layer or silicon nitride layer (SiNx) or multiple layers thereof.

On the first insulating layer 115, a gate electrode 120c is disposed at the region corresponding to the channel region defined by dopping the impurities. At the same level layer as the gate electrode 120c, the scan line 120a and the lower electrode 120b of the capacitor are formed.

The gate electrode 120c includes at least selected one molybdenium (Mo), aluminum (Al), chromium (Cr), gold (Au), titanium (Ti), nickel (Ni), neodium (Nd) and copper (Cu) or alloyed metal of them. Otherwise, the gate electrode 120c includes multiple layers including at least selected one molybdenium (Mo), aluminum (Al), chromium (Cr), gold (Au), titanium (Ti), nickel (Ni), neodium (Nd) and copper (Cu) or alloyed metal of them. For example, the gate electrode 120c includes two layers such as molybdenium/aluminum-neodium or molybdenium/aluminum.

The scan line 120a includes at least selected one molybdenium (Mo), aluminum (Al), chromium (Cr), gold (Au), titanium (Ti), nickel (Ni), neodium (Nd) and copper (Cu) or alloyed metal of them. Otherwise, the scan line 120a includes multiple layers including at least selected one molybdenium (Mo), aluminum (Al), chromium (Cr), gold (Au), titanium (Ti), nickel (Ni), neodium (Nd) and copper (Cu) or alloyed metal of them. For example, the scan line 120a includes double layer such as molybdenium/aluminum-neodium or molybdenium/aluminum.

A second insulating layer 125 as a layer insulator is formed on the substrate 110 including the scan line 120a, the lower electrode 120b of the capacitor, and gate electrode 120c. The second insulating layer 125 includes a silicon oxide (SiOx) layer or silicon nitride layer (SiNx) or multiple layers thereof.

The second insulating layer 125 and the first insulating layer 115 include contact holes 130b and 130c exposing some portions of the semiconductor layer 111.

A drain electrode 140c and a source electrode 140d electrically connected to the semiconductor layer 111 through the contact holes 130b and 130c penetrating the second insulating layer 125 and the first insulating layer 115 are formed in the pixel area.

The drain electrode 140c and the source electrode 140d include one conductive layer or multiple conductive layers. When the drain electrode 140c and the source electrode 140d include single conductive layer, they include at least selected one molybdenium (Mo), aluminum (Al), chromium (Cr), gold (Au), titanium (Ti), nickel (Ni), neodium (Nd) and copper (Cu) or alloyed metal of them. When the drain electrode 140c and the source electrode 140d include multiple conductive layers, they include double layer including molybdenium/aluminum-neodium or molybdenium/aluminum or triple layer including molybdenium/aluminum/molybdenium or molybdenium/aluminum-neodium/molybdenium.

The data line 140a, the upper electrode 140b of the capacitor and the power line 140e are formed at the same layer level as the drain electrode 140c and the source electrode 140d.

The data line 140a and the power line 140e disposed at the pixel area include single conductive layer or multiple conductive layers. When the data line 140a and the power line 140e include single conductive layer, they include at least selected one molybdenium (Mo), aluminum (Al), chromium (Cr), gold (Au), titanium (Ti), nickel (Ni), neodium (Nd) and copper (Cu) or alloyed metal of them. When the data line 140a and the power line 140e include multiple conductive layers, they include double layer including molybdenium/aluminum-neodium or molybdenium/aluminum or triple layer including molybdenium/aluminum/molybdenium or molybdenium/aluminum-neodium/molybdenium.

A third insulating layer 145 is formed on the data line 140a, the upper electrode 140b of the capacitor, the drain electrode 140c, the source electrode 140d, and the power line 140e. The third insulating layer 145 may include planazation film for reducing level differences of layers there-below. The third insulating layer 145 may be formed by spin coating method in which an organic material such as polyimide, benzocyclobutene group resin, or acrylate is coated in liquid phase and then hardened. Otherwise, the third insulating layer 145 may be formed by SOG (silicate on glass) method with inorganic material such as silicon oxide or silicon nitride.

The third insulating layer 145 has a via hole 165 exposing any one of the drain electrode 140c and the source electrode 140d. On the third insulating layer 145, there is a first electrode 160 electrically connected to any one of the drain electrode 140c and source electrode 140d through the via hole 165.

The first electrode 160 may be the anode electrode. Here, when the organic electroluminescent display device has the back-face emission structure of the double-face emission structure, the first electrode 160 includes a transparent material such as ITO (Indium Tin Oxide), IZO (Indium Zinc Oxide) or ZnO (Zinc Oxide). When the organic electroluminescent display device has the front-face emission structure, the first electrode 160 further includes reflection layer including at least one of aluminum (Al), silver (Ag) and nickel (Ni) under the transparent layer including at least one of ITO (Indium Tin Oxide), IZO (Indium Zinc Oxide) and ZnO (Zinc Oxide). For other example, the reflection layer may be sandwiched between two transparent layers including at least one of ITO (Indium Tin Oxide), IZO (Indium Zinc Oxide) and ZnO (Zinc Oxide).

On the first electrode 160, a fourth insulating layer 155 is formed to electrically isolate each first electrode 160 with neighbored first electrode 160 and to include an aperture 175 exposing some portions of the first electrode 160. On the exposed first electrode 160 through the aperture 175, an organic layer 170 is formed.

On the organic layer 170, a second electrode 180 is formed. The second electrode 180 may be a cathode electrode. The second electrode 180 includes a metal material having low working function such as magnethium (Mg), calcium (Ca), aluminum (Al), or silver (Al) or alloy of them.

Figure 5A:
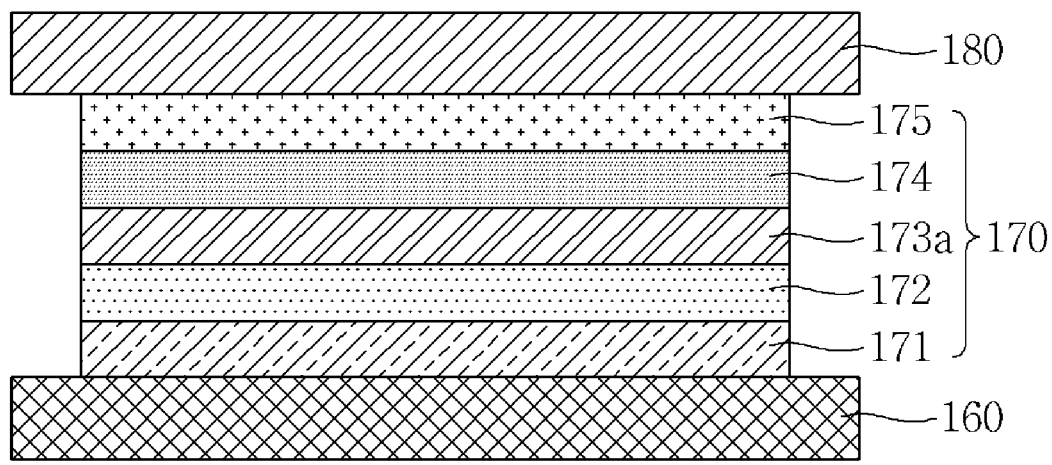
FIGS. 5a to 5b are cross sectional views illustrating the emitting diodes according to the various embodiments of the present disclosure.
Figure 5B:
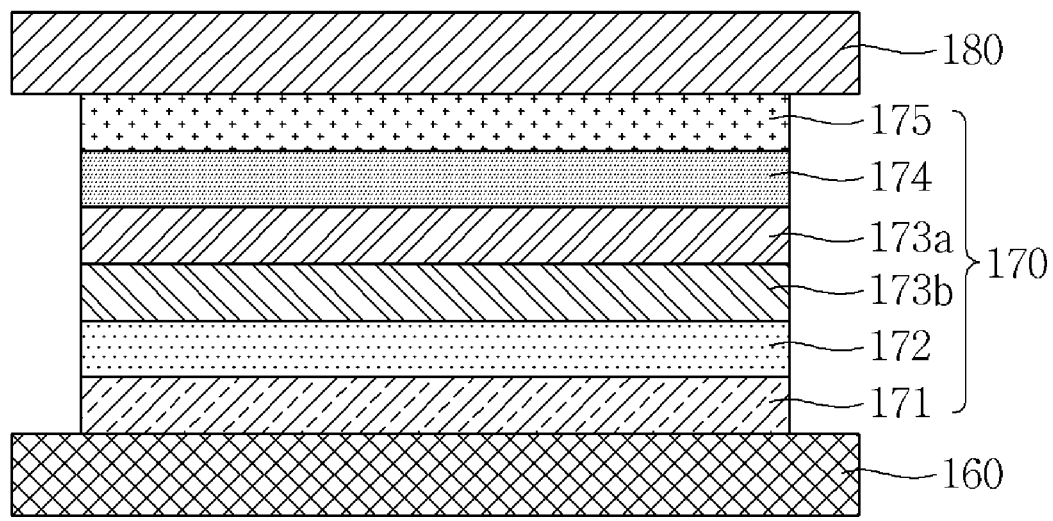

From now, the organic layer will be explained in detail. FIGS. 5a and 5b are cross sectional views illustrating light emitting diode according to the first embodiment of the present disclosure. The light emitting diode comprises a first electrode, an organic layer, and a second electrode and irradiates the light.

Referring to FIG. 5a, the organic electroluminescent display device according to the first embodiment of the present disclosure comprises the first electrode 160, the organic layer 170 disposed on the first electrode 160, and the second electrode 180 dispose on the organic layer.

The organic layer 170 includes the hole injection layer 171, the hole transport layer 172, the electron transport emission layer 173a, the electron transport layer 174, and the electron injection layer 175, disposed sequentially from the first electrode 160.

The hole injection layer 171 receives holes from the first electrode 160, as the anode electrode, and injects holes to the hole transport layer 172. The hole injection layer 171 includes at least selected one of CuPc (cupper phthalocyanine), PEDOT (poly(3,4)-ethylenedioxythiophene), PANI (polyaniline), NPD (N,N-dinaphthyl-N,N'-diphenyl benzidine) and perylene group. The thickness of the hole injection layer 171 is selected one thickness in range of 1~70 nm.

The hole transport layer 172 receives holes from the hole injection layer 171 and transports holes to the electron transport emission layer 173a. The hole transport layer 172 includes at least selected one of NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4''-Tris(N-3-methylphenyl-N-phenyl-amino)-triphenylamine) and NPD triphenyl amine group. The thickness of the hole transport layer 172 is selected one thickness in range of 50~200 nm.

The electron injection layer 175 receives electrons from the second electrode 180, as the cathode electrode, and injects electrons to the electron transport layer 174. The electron injection layer 175 includes at least selected one of Alq3(tris (8-hydroxyquinolino)aluminum), PBI), TAZ, spiro-PBD, BAlq, SAlq, LiF and Liq. The thickness of the electron injection layer 175 is selected one thickness in range of 0.1~3 nm.

The electron transport layer 174 receives electrons from the electron transport layer 175 and transport electrons to the electron transport emission layer 173a. The electron transport layer 174 includes at least selected one of Anthracene group, Alq3 and BAlq. The thickness of the electron transport layer 174 is selected one thickness in range of 10~50 nm.

The electron transport emission layer 173a includes an emission material including at least selected one of red, green and blue colors and an electron transport material.

In the case of the electron transport emission layer 173a irradiating red color, the electron transport emission layer 173a includes a host material including CBP (carbazole biphenyl) or mCP (1,3-bis(carbazol-9-yl)) with the emission material and the electron transporting material. The emission material comprises selected one of a phosphor material and a fluorescence material. The phosphor material comprises dopant including at least selected one of PIQIr (acac)(bis(1-phenylisoquinoline)acetylacetonate iridium), PQIr (acac) (bis(1-phenylquinoline)acetylacetonate iridium), PQIr (tris (1-phenylquinoline)iridium) and PtOEP (octaethylporphyrin platinum). The fluorescence material comprises PBD:Eu(DBM)3(Phen), Perylene or BAlq group. The electron transport material includes at least selected one of Anthracene group, Alq3 and BAlq.

In the case of the electron transport emission layer 173a irradiating green color, the electron transport emission layer 173a includes a host material including CBP or mCP with the emission material and the electron transporting material. The emission material comprises selected one of a phosphor material and a fluorescence material. The phosphor material comprises dopant including Ir(ppy)3(fac tris(2-phenylpyridine)iridium). The fluorescence material comprises Alq3 group. The electron transport material includes at least selected one of Anthracene group, Alq3 and BAlq.

In the case of the electron transport emission layer 173a irradiating blue color, the electron transport emission layer 173a includes a host material including CBP or mCP with the emission material and the electron transporting material. The emission material comprises selected one of a phosphor material and a fluorescence material. The phosphor material includes dopant including (4,6-F2 ppy)2Irpic. The fluorescence material includes at least selected one of spiro-DPVBi, spiro-6P, distill Benzene (DSB), distill Arylene (DSA), PFO polymer, PPV polymer, Perylene group, Anthracene group, ADN and AND derivatives. The electron transport material includes Anthracene group, Alq3 or BAlq.

The electron transport material concentration of the electron transport emission layer 173a can have 2~20 wt % to the emission material weight amount, more preferably it may be 5 wt %.

When the concentration of the electron transport material is over 2 wt % to the emission material, the electron can be smoothly transported in the electron transport emission layer 173a so that the region in which electrons meet with holes to form excitons is formed near to the hole transport layer 172. When the concentration of the electron transport material is lower than 20 wt % to the emission material, electrons can be effectively transported and the emission efficiency of the electron transport emission layer 173a can be maintained constantly. This will be explained in FIG. 6a in detail.

The thickness of the electron transport emission layer 173a according to the first embodiment of the present disclosure is selected one value in range of 20~60 nm. With this range of the electron transport emission layer 173a thickness, the emission efficiency has maximum value with the minimum driving voltage. As the thickness of the organic layer 170 or the electron transport emission layer 173a included in the organic layer 170 is getting thicker, the emission efficiency will be better, but the higher driving voltage should be required. On the contrary, as the thickness is getting thinner, the driving voltage is getting lowered, but the emission efficiency would be worse. Therefore, the emission efficiency and the driving voltage can be optimized when the thickness of the electron transport emission layer 173a is selected one value in range of 20~60 nm.

Referring to FIG. 5b, the organic electroluminescent display device according to the second embodiment of the present disclosure includes a first electrode 160, an organic layer 170 on the first electrode 160, and a second electrode 180 on the organic layer 170. The organic layer 170 includes the hole injection layer 171, the hole transport layer 172, the emission layer 173b, the electron transport emission layer 173a, the electron transport layer 174, and the electron injection layer 175 sequentially from the first electrode 160.

In the second embodiment, by comparing with the first embodiment shown in FIG. 5a, the organic electroluminescent display device further includes an emission layer 173b. In addition, the thickness of the electron transport emission layer 173a has different thickness from that of the first embodiment. Hereinafter, the same elements with the FIG. 5a will not be explained.

The emission layer 173b of the organic electroluminescent display device according to the second embodiment of the present disclosure includes the same emission materials of the electron transport emission layer 173a of the organic electroluminescent display device according to the first embodiment. Further, the electron transport emission layer 173a of the organic electroluminescent display device according to the second embodiment of the present disclosure includes the same materials of the electron transport emission layer 173a of the organic electroluminescent display device according to the first embodiment.

The electron transport material concentration of the electron transport emission layer 173a can have 2~20 wt % to the emission material weight amount of the electron transport emission layer 173a, more preferably it may be 5 wt %. The thickness of the emission layer 173b is selected one value in range of 2~30 nm. The thickness of the electron transport emission layer 173a according to the second embodiment is selected one value in range of 5~40 nm.

From now, the efficiency of the organic electroluminescent display device according to the preferred embodiments of the present disclosure will be explained in detail.

Figure 6A:
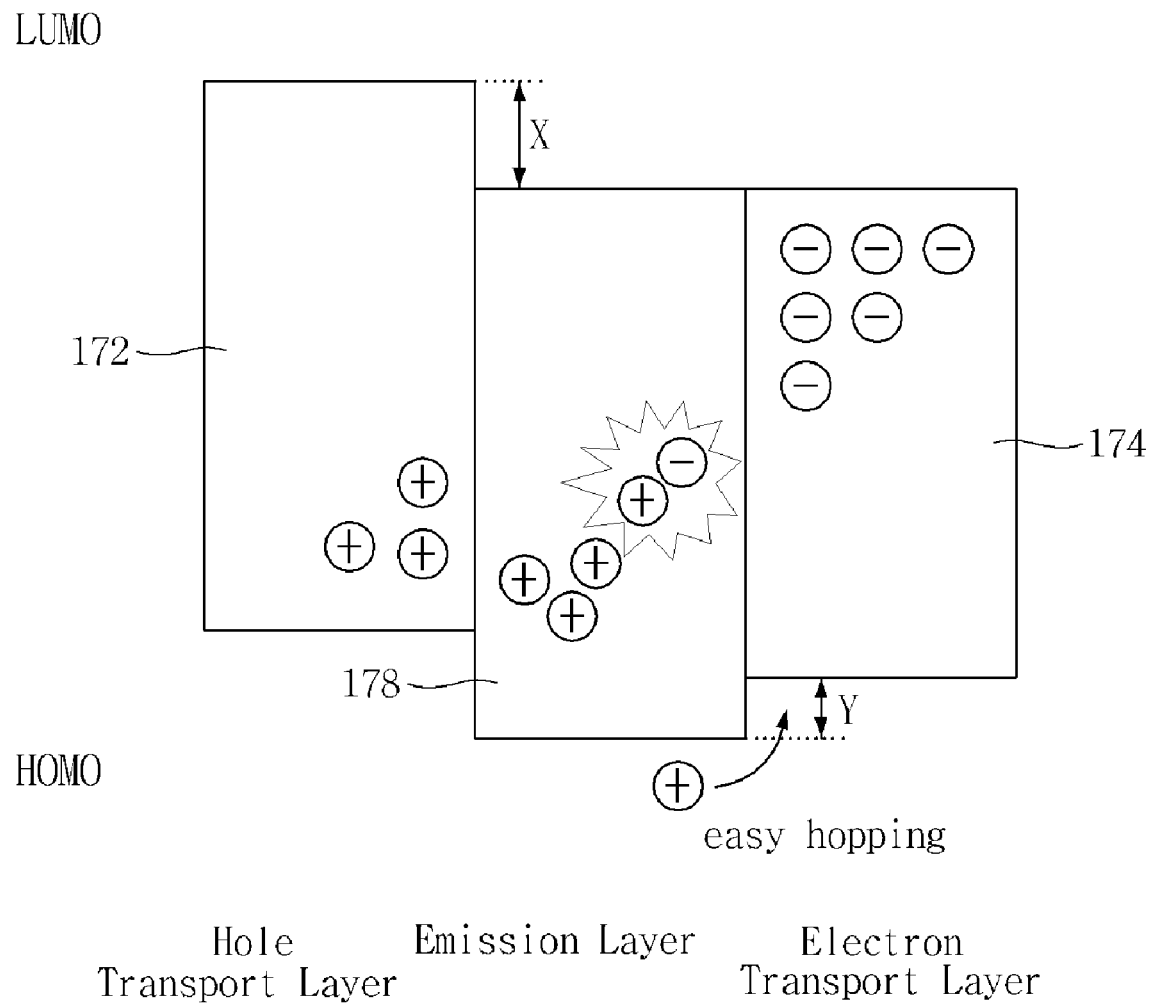
FIG. 6a is a detail diagram illustrating the emission layer of the organic electroluminescent display device according to the related art.
Figure 6B:
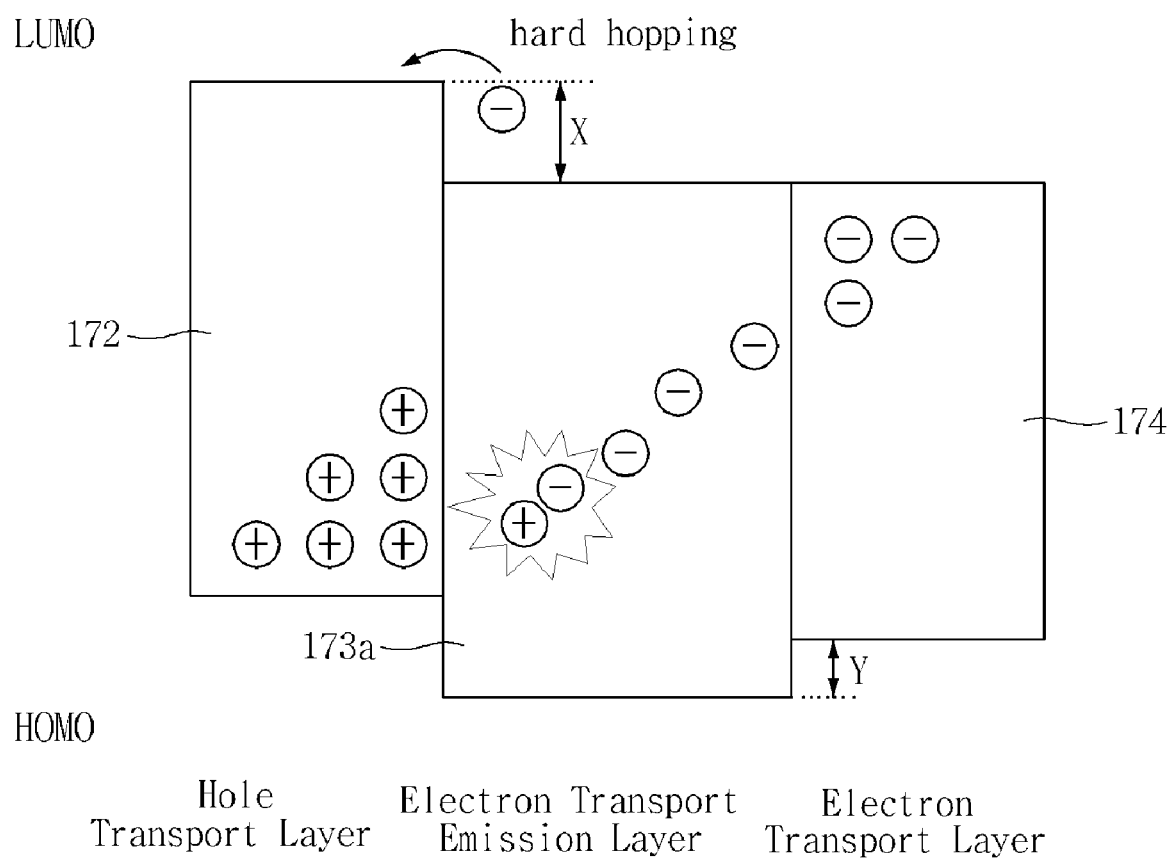
FIGS. 6b to 6c are detail diagrams illustrating the emission layers of the organic electroluminescent display device according to the various embodiments of the present disclosure.
Figure 6C:
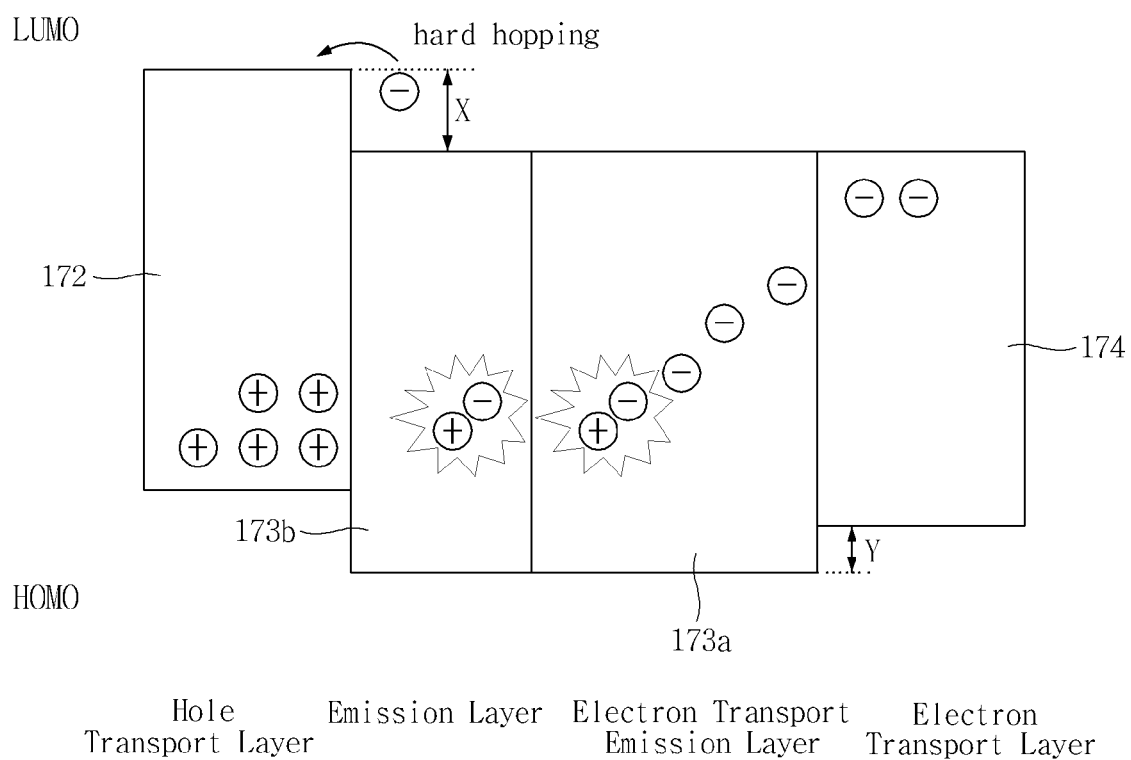

FIG. 6a is a detail diagram illustrating the organic layer 170 of the organic electroluminescent display device according to the related art. FIGS. 6b and 6c are detail diagrams illustrating the organic layer 170 according to the preferred embodiments of the present disclosure.

In FIG. 6a, the organic layer 170 includes the hole transport layer 172, the emission layer 178 and the electron transport layer 174. Holes received from the first electrode 160 and the hole injection layer 171 are transported to the emission layer 178 via the hole transport layer 172. Whilst, electrons received from the second electrode 180 and the electron injection layer 175 are transported to the emission layer 178 via the electron transport layer 174. Electrons and holes are met and form excitons to irradiate light.

Generally, due to the difference of the materials, there is a discontinuous interfacing characteristics between the emission layer 178 and the electron transport layer 174. Therefore, electrons may not be transported from the electron transport layer 174 to the emission layer 178 effectively or smoothly.

Further, as the hole mobility in the hole transport layer 172 is about 10-100 times faster than the electron mobility in the electron transport layer 174, the holes can be earlier injected into the emission layer 178 than the electrons. Furthermore, when the organic material in which the hole mobility is faster than the electron mobility is used for the emission layer 178, the moving speed of holes is faster than the moving speed of electrons, so that the excitor may be formed near the interface between the electron transport layer 174 and the emission layer 178. When there are a lot of holes at the interface of emission layer 178 and the electron transport layer 174, as the HOMO (highest occupied molecular orbital) difference (Y) between the electron transport layer. 174 and the emission layer 178 is very small, the holes in the emission layer 178 can easily hop into the electron transport layer 174. This causes the unstability of the electron transport layer 174. As a result, the life time of the organic electroluminescent element will be reduced. That is, as electrons may be easily accumulated at the interface between the electron transport layer 174 and the emission layer 178, or holes may be easily hopped to the electron transport layer 174, the life time and characteristics of the organic electroluminescent material are degraded.

In the interim, as the holes collide with the electrons near the interface between the emission layer 178 and the electron transport layer 174 and form the excitons, the electrons are rarely existing near the interface between the emission layer 178 and the hole transport layer 172. Furthermore, as the LUMO (low unoccupied molecular orbital) difference (X) between the hole transport layer 172 and the emission layer 178 is very large, the possibility of electron hopping to the hole transport layer 172 is very low. Therefore, the hole transport layer 172 has no problems.

According to the present disclosure shown in the FIGS. 6b and 6c, the above problems can be prevented. Referring to FIG. 6b, the organic layer 170 of the organic electroluminescent display device according to the present disclosure includes the hole transport layer 172, the electron transport emission layer 173a, and the electron transport layer 174.

As described with FIG. 5a, the electron transport emission layer 173a is made by mixing the electron transport material with the emission material irradiating one of red, green and blue colors. For the case of irradiating red color, the electron transport emission layer 173a preferably comprises the emission material including BAlq group, and the electron transport material including at least selected one of Anthracene group, Alq3 group and BAlq group. For the case of irradiating green color, the electron transport emission layer 173a preferably comprises the emission material including Alq3 group, and the electron transport material including at least selected one of Anthracene group, Alq3 group and BAlq group. For the case of irradiating blue color, the electron transport emission layer 173a preferably comprises the emission material including at least selected one of Perylene group, Anthracene group, ADN and AND derivatives, and the electron transport material including at least selected one of Anthracene group, Alq3 group and BAlq group.

The electron transport material concentration of the electron transport emission layer 173a can have 2-20 wt % to the emission material weight amount of the electron transport emission layer 173a, more preferably it may be 5 wt %. When the concentration of the electron transport material is over 2 wt % to the emission material, the electron can be smoothly transported in the electron transport emission layer 173a so that the region in which electrons meet with holes to form excitons is formed near to the hole transport layer 172. When the concentration of the electron transport material is lower than 20 wt % to the emission material, electrons can be effectively transported and the emission efficiency of the electron transport emission layer 173a can be maintained constantly.

The principle of the above mentioned effects will be explained in detail. By mixing the electron transporting material with the emission material of the emission layer 173b, the electron transport emission layer 173a having enhanced electron transporting ability is formed. Therefore, the electron mobility in the electron transport emission layer 173a is enhanced than in the emission layer 178 in the related art. The electrons can be effectively and smoothly injected into the electron transport emission layer 173a, and more fastly moved in the electron transport emission layer 173a. As a result, the exciton area which was easily formed near the interface with the electron transport layer 174 can be moved apart from electron transport layer 174 to the hole transport layer 172 or the middle portion of the electron transport emission layer 173a. Therefore, unlike the related art, holes and electrons do not meet near the interface with the electron transport layer 174 to irradiate light or holes do not hop into the electron transport layer 174. So, it is possible to reduce the possibility for making the electron transport layer 174 unstable and prevent the life time of the organic electroluminescent element from being reduced.

In the interim, even if, due to the electron transport material, more excitons are formed at the middle portion of the electron transport emission layer 173a and then there are a lot of electrons not colliding with holes and not forming exitons near the hole transport layer 172, these electrons can not easily hop to the hole transport layer 172 (so called 'hard hopping') because the difference of LUMO (low unoccupied molecular orbital) (X) between the electron transport emission layer 173a and the hole transport layer 172. Therefore, there is no reverse effect of the present disclosure in which electrons make a bad effect to the hole transport layer 172 by hopping to the hole transport layer 172.

Referring to FIG. 6c, the organic layer 170 of the organic electroluminescent display device according to the second embodiment of the present disclosure includes the hole transport layer 172, the emission layer 173b, the electron transport emission layer 173a, and the electron transport layer 174.

Comparing with the first embodiment of the present disclosure shown in FIG. 6b, the organic electroluminescent display device according to the second embodiment further includes the emission layer 173a. The thickness of the electron transport emission layer 173a has different thickness from that of the first embodiment. Hereinafter, the same elements with the FIG. 6b will not be explained.

The electron transport material concentration of the electron transport emission layer 173a can have 2~20 wt % to the emission material weight amount of the electron transport emission layer 173a, more preferably it may be 5 wt %. The thickness of the emission layer 173b is selected one value in range of 2~30 nm. The thickness of the electron transport emission layer 173a according to the second embodiment is selected one value in range of 5~40 nm.

In the organic electroluminescent display device according to the second embodiment of the present disclosure, the excitons are formed at the emission layer 173b and the electron transport emission layer 173a to irradiate light.

Also, by replacing the emission layer 173b in the related art with a combination layer including the emission layer 173b and the electron transport emission layer 173a, the electrons can be effectively and smoothly move to the electron transport emission layer 173a and more fastly moved in the electron transport emission layer 173a. As a result, the exciton area which was easily formed near the interface with the electron transport layer 174 can be moved apart from the electron transport layer 174 to the emission layer 173b or the middle portion of the electron transport emission layer 173a. As a result, unlike the related art, holes and electrons do not meet near the interface with the electron transport layer 174 to irradiate light or holes do not hop into the electron injection layer 175. So, it is possible to reduce the possibility for making electron transport layer 174 unstable and prevent the life time of the organic electroluminescent element from being reduced.

In the interim, even if, due to the electron transport material, more excitons are formed at the middle portion of the electron transport emission layer 173a and then there are a lot of electrons not colliding with holes and not forming excitons near the hole transport layer 172, these electrons can not easily hop to the hole transport layer 172 (so called 'hard hopping') because the difference of LUMO (low unoccupied molecular orbital) (X) between the electron transport emission layer 173a and the hole transport layer 172. Therefore, there is no reverse effect of the present disclosure in which electrons make a bad effect to the hole transport layer 172 by hopping to the hole transport layer 172.

The following Table 1 shows the experimental result of the organic electroluminescent display device according to the second embodiment of the present disclosure and experimental result of the comparing example according to the of the related art. The electron transport emission layer 173a of the second embodiment includes 5 wt % of the electron transport material.

TABLE 1

|  | Hole Transport Layer/Emission Layer/Electron Transport Layer (Comparing Example) | Hole Transport Layer/Emission Layer/Electron Transport Emission Layer/Electron Transport Layer (Second Embodiment) |
|---|---|---|
| Thickness (nm) | 60/25/30 | 60/5/30/30 |
| Driving Voltage (V) | 5 | 5.5 |
| Color Coordinate | (0.135, 0.173) | (0.135, 0.185) |
| Life time (hr) | 80 | 190 |

The most important result is that the life time of the organic electroluminescent display device according to the second embodiment is 190 hr which is longer than 80 hr of the organic electroluminescent display device according to the comparing example of the related art. The life time is the lap time until the brightness (luminescence) is lowed to 970 nit when the normal brightness of the light irradiated from the organic layer 170 is 1000 nit. This is so called as the '97% life time characteristics.' The '97% life time characteristics' of the commercialized product should be at least 200 hr. According to the organic electroluminescent display device of the second embodiment, the '97% life time' is 190 hr which is 110 hr longer than related art.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic electroluminescent display device comprising:
    a substrate including thin film transistor;
    a first electrode disposed on the substrate and connected to the thin film transistor;
    a hole transport layer on the first electrode;
    an electron transport emission layer on the first electrode;

an electron transport layer on the electron transport emission layer; and a second electrode on the electron transport layer;

wherein the electron transport emission layer includes an electron transport material and an emission material, in which excitons are formed far from the electron transport layer near to the hole transport layer in the electron transport emission layer, and wherein the electron transport emission layer includes 5 wt % of the electron transport material.

2. The device according to the claim 1, wherein a hole injection layer is disposed between the first electrode and the hole transport layer.

3. The device according to the claim 1, wherein an electron injection layer is disposed between the electron transport layer and the second electrode.

4. The device according to the claim 1, wherein the thickness of the electron transport emission layer has range of 20-60 nm.

5. The device according to the claim 1, wherein the emission material irradiates one color of red, green and blue colors.

6. The device according to the claim 5, wherein, when the emission material irradiates red color, the emission material includes BAlq group; and the electron transport material includes at least selected one of Anthracene group, Alq3 group, and BAlq group.

7. The device according to the claim 5, wherein, when the emission material irradiates green color, the emission material includes Alq group; and the electron transport material includes at least selected one of Anthracene group, Alq3 group, and BAlq group.

8. The device according to the claim 5, wherein, when the emission material irradiates blue color, the emission material includes at least selected one of Perylene group, Anthracene group, ADN and AND derivatives; and the electron transport material includes at least selected one of Anthracene group, Alq3 group, and BAlq group.

9. An organic electroluminescent display device comprising:

a substrate including thin film transistor;

a first electrode disposed on the substrate and connected to the thin film transistor;

a hole transport layer on the first electrode;

an emission layer on the hole transport layer;

an electron transport emission layer on the emission layer;

an electron transport layer on the electron transport emission layer; and a second electrode on the electron transport layer;

wherein the electron transport emission layer includes an electron transport material and an emission material, in which excitons are formed far from the electron transport layer near to the hole transport layer in the electron transport emission layer, and wherein the electron transport emission layer includes 5 wt % of the electron transport material.

10. The device according to the claim 9, wherein a hole injection layer is disposed between the first electrode and the hole transport layer.

11. The device according to the claim 9, wherein an electron injection layer is disposed between the electron transport layer and the second electrode.

12. The device according to the claim 9, wherein the thickness of the emission layer has range of 2-30 nm, and the thickness of the electron transport emission layer has range of 5-40 nm.

13. The device according to the claim 9, wherein the emission layer and the emission material irradiate one color of red, green and blue colors.

14. The device according to the claim 13, wherein, when the emission layer and the emission material irradiates red color, the emission material includes BAlq group; and the electron transport material includes at least selected one of Anthracene group, Alq3 group, and BAlq group.

15. The device according to the claim 13, wherein, when the emission layer and the emission material irradiates green color, the emission material includes Alq group; and the electron transport material includes at least selected one of Anthracene group, Alq3 group, and BAlq group.

16. The device according to the claim 13, wherein, when the emission layer and the emission material irradiates blue color, the emission material includes at least selected one of Perylene group, Anthracene group, ADN and AND derivatives; and the electron transport material includes at least selected one of Anthracene group, Alq3 group, and BAlq group.

17. The device according to the claim 9, wherein the emission layer includes a material same with the emission material of the electron transport emission layer.

* * * * *